(12) United States Patent
Perkins

(10) Patent No.: US 7,706,769 B2
(45) Date of Patent: Apr. 27, 2010

(54) ADAPTIVE INTERMODULATION DISTORTION FILTER FOR ZERO-IF RECEIVERS

(75) Inventor: Richard Perkins, Encinitas, CA (US)

(73) Assignee: ST-Ericsson SA, Plan-les-Ouates (CH)

( * ) Notice: Subject to any disclaimer, the term of this patent is extended or adjusted under 35 U.S.C. 154(b) by 608 days.

(21) Appl. No.: 10/560,852

(22) PCT Filed: Jun. 1, 2004

(86) PCT No.: PCT/IB2004/050819

§ 371 (c)(1),
(2), (4) Date: Dec. 5, 2005

(87) PCT Pub. No.: WO2004/109941

PCT Pub. Date: Dec. 16, 2004

(65) Prior Publication Data

US 2007/0105519 A1    May 10, 2007

Related U.S. Application Data

(60) Provisional application No. 60/475,755, filed on Jun. 4, 2003.

(51) Int. Cl.
*H04B 1/10* (2006.01)
(52) U.S. Cl. .............. 455/295; 455/63.1; 455/296
(58) Field of Classification Search .......... 455/295–296, 455/63.1, 67.13, 226.1, 226.2, 200.1, 232.1, 455/552.1, 553.1; 370/320, 335, 342
See application file for complete search history.

(56) References Cited

U.S. PATENT DOCUMENTS

| | | | | |
|---|---|---|---|---|
| 4,731,877 A | * | 3/1988 | Moon | 455/340 |
| 5,519,890 A | | 5/1996 | Pinckley | |
| 6,035,213 A | * | 3/2000 | Tokuda et al. | 455/553.1 |
| 6,108,529 A | * | 8/2000 | Vice et al. | 455/323 |
| 6,134,430 A | * | 10/2000 | Younis et al. | 455/340 |
| 6,154,641 A | * | 11/2000 | Zhang | 455/112 |
| 6,175,279 B1 | * | 1/2001 | Ciccarelli et al. | 330/296 |
| 6,487,399 B1 | * | 11/2002 | Rajaniemi et al. | 455/226.1 |
| 6,606,484 B1 | * | 8/2003 | Faulkner | 455/131 |
| 6,606,488 B1 | * | 8/2003 | Konig et al. | 455/295 |
| 6,704,378 B2 | * | 3/2004 | Jagger et al. | 375/346 |
| 6,718,166 B2 | * | 4/2004 | Cordone et al. | 455/306 |
| 6,807,405 B1 | * | 10/2004 | Jagger et al. | 455/296 |
| 6,944,427 B2 | * | 9/2005 | Haub et al. | 455/63.1 |
| 6,992,519 B2 | * | 1/2006 | Vilander et al. | 327/359 |
| 7,203,472 B2 | * | 4/2007 | Seppinen et al. | 455/226.1 |
| 7,317,698 B2 | * | 1/2008 | Jagger et al. | 370/328 |

FOREIGN PATENT DOCUMENTS

| | | |
|---|---|---|
| EP | 0 812 069 A2 | 12/1997 |
| WO | WO 01/69803 A1 | 9/2001 |

\* cited by examiner

*Primary Examiner*—Pablo N Tran
(74) *Attorney, Agent, or Firm*—E. Russell Tarleton; Seed IP Law Group PLLC

(57) ABSTRACT

A zero-IF receiver includes an adaptive filter that is enabled when intermodulation distortion is detected. The adaptive filter is configured as a notch filter that is centered at the location of the second-order intermodulation distortion, which, in a zero-IF receiver, is at zero Hertz. In a preferred embodiment, the frequency response of the high pass filter that is typically used in a conventional zero-IF receiver is adjusted when intermodulation distortion is detected. Preferably, the detection of the intermodulation distortion is based on one or more of the digital baseband signals, for ease of implementation, but analog processing may also be employed.

10 Claims, 2 Drawing Sheets

ADAPTIVE INTERMODULATION DISTORTION FILTER FOR ZERO-IF RECEIVERS

CROSS REFERENCE TO RELATED APPLICATION

This application claims the benefit of U.S. provisional application Ser. No. 60/475,755, filed Jun. 4, 2003 which is incorporated herein in whole by reference.

This invention relates to the field of communications, and in particular to zero-IF receivers.

Direct down-conversion-to-DC-baseband, or zero-IF (intermediate frequency), receivers are commonly used in portable devices because such receivers can typically be embodied as a single integrated circuit with minimal external components.

Zero-IF receivers, however, have limited inherent ability to reject unwanted second order intermodulation distortion at their output, which typically occurs when an AM (amplitude modulated) interference source is present. Such AM sources include mobile telephone handsets that use TDMA and pulsed GSM signals. The intermodulation distortion caused by these sources cause degraded receiver performance and, in the case of a receiver in a mobile telephone, dropped calls.

A variety of techniques are commonly employed to improve a receiver's ability to reject unwanted second order intermodulation distortion, such as component matching and calibration to improve circuit balance, and balancing the duty-cycle of the local oscillator. The success of these techniques, however, has been limited.

It is an object of this invention to provide a method and system to improve a zero-IF receiver's ability to reject second order intermodulation distortion. It is a further object of this invention to provide a method and system for improving a receiver's ability to reject second order intermodulation distortion dynamically. It is a further object of this invention to provide a method and system for improving a receiver's ability to reject second order intermodulation distortion with minimal changes to the structure of a conventional receiver.

These objects, and others, are achieved by providing a zero-IF receiver with an adaptive filter that is enabled when intermodulation distortion is detected. The adaptive filter is configured as a notch filter that is centered at the location of the second-order intermodulation distortion, which, in a zero-IF receiver, is at zero Hertz. In a preferred embodiment, the frequency response of the high pass filter that is typically used in a conventional zero-IF receiver is adjusted when intermodulation distortion is detected. Preferably, the detection of the intermodulation distortion is based on one or more of the digital baseband signals, for ease of implementation, but analog processing may also be employed.

Throughout the drawings, the same reference numeral refers to the same element, or an element that performs substantially the same function.

Figure 1:
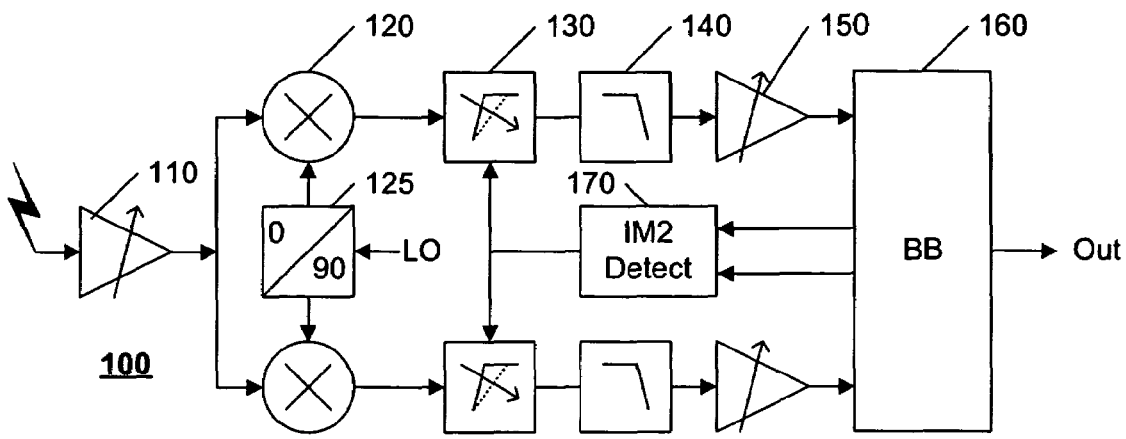
FIG. 1 illustrates an example block diagram of a zero-IF receiver with adaptive intermodulation distortion filtering in accordance with this invention.

FIG. 1 illustrates an example block diagram of a zero-IF receiver 100 with adaptive intermodulation distortion filtering in accordance with this invention. The receiver 100 includes a tunable front end 110 whose output is demodulated by a quadrature demodulator to provide quadrature output signals that are processed by a baseband processor 160, typically in digital form. For ease of illustration, only one branch of the quadrature demodulator is described herein, the other branch being functionally equivalent, but operating at an orthogonal phase provided by the quadrature phase generator 125. The output of the front end 110 is demodulated by a mixer 120, and filtered by a filter 130, 140. A tunable amplifier 150 provides a baseband analog signal, which is processed by the aforementioned baseband processor 160 to provide the receiver output.

Second order intermodulation distortion in a receiver appears at the IF-frequency; in the case of a zero-IF receiver, the second order intermodulation distortion appears at zero Hertz (DC). In accordance with this invention, the receiver 100 also includes an intermodulation distortion detector 170 that is configured to dynamically control the filter 130 to reduce the effects of second-order intermodulation distortion. The detector 170 is configured to assert a detection signal when intermodulation distortion is detected. In a straightforward embodiment, when this detection signal is asserted, the filter 130 is enabled; otherwise, it is bypassed. In a more typical embodiment, the function of the filter 130 is incorporated into one or more existing filters in a typical receiver, as discussed further below.

A zero-IF receiver commonly includes a high-pass filter at zero Hertz that is used as a very narrow notch filter for removing the DC component from received signals. This DC notch filter is often configured as part of a DC tracking loop that optimizes the receiver sensitivity and minimizes fading for optimal data rate performance. Often, as part of a tracking loop, the DC notch filter is configured to provide adjustable frequency response, depending upon whether the loop is in a search-mode or lock-mode.

In a preferred embodiment of this invention, the filter 130 comprises a filter having an adjustable frequency response, so that it can be also used as the aforementioned conventional DC notch filter for optimizing the receiver sensitivity. Under normal conditions, in the absence of detected intermodulation distortion, the filter 130 is configured as a conventional narrow DC notch filter. When intermodulation distortion is detected, the filter 130 is configured as a wider DC notch filter, to filter-out second order intermodulation distortion by attenuating signal components of the baseband signal in the frequency band of the intermodulation distortion. Typically, the narrow-mode of the filter 130 has a notch width of about +/−1 kHz, while the wide-mode of the filter 130 has a notch-width of about +/−60 kHz. Although the intermodulation distortion may be narrower or wider than +/−60 kHz, depending upon the source of the distortion, this notch-width has been found to substantially reduce the effects of commonly occurring second-order intermodulation distortion while still retaining adequate receiver performance.

If the filter 130 is also part of the aforementioned DC tracking loop, the filter 130 is also configurable to a third frequency response, corresponding to the aforementioned DC tracking search mode. The search-mode notch-width will be dependent upon the desired response time and sensitivity of the DC tracking loop.

Preferably, the intermodulation distortion detector 170 uses digital signals from the baseband processor 160 to determine whether intermodulation distortion is present, as discussed further below.

Figure 2:
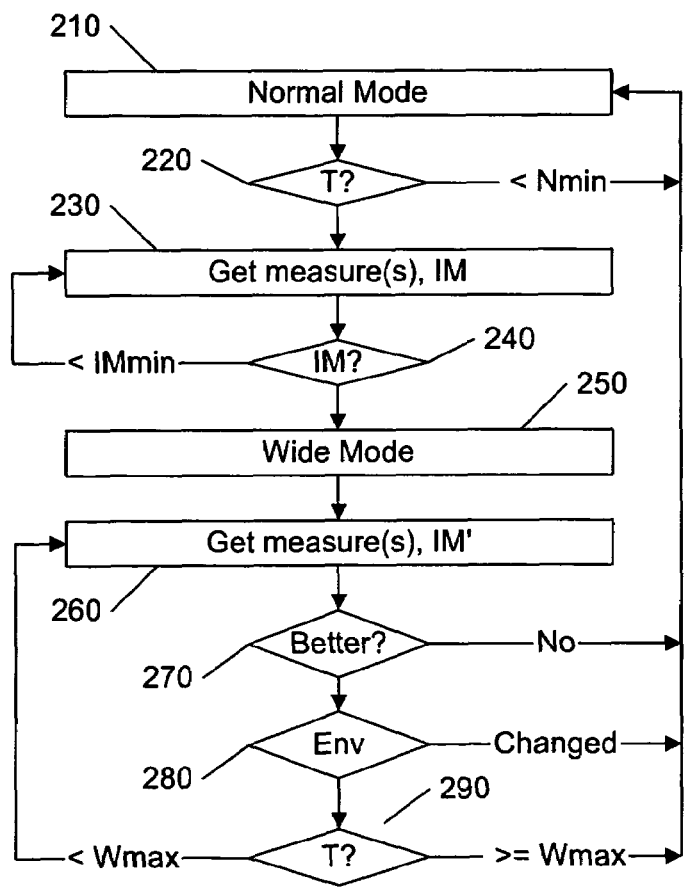
FIG. 2 illustrates an example flow diagram of a method of adaptive intermodulation distortion filtering in accordance with this invention.

FIG. 2 illustrates an example flow diagram of a method of adaptive intermodulation distortion filtering in accordance with this invention. At 210, the receiver is placed in the "normal-mode", wherein the intermodulation filter (130 in FIG. 1) is bypassed or, if the filter is also used as the conventional DC notch filter as discussed above, it is set to the aforementioned narrow-mode. To assure proper 'normal' performance, the receiver is preferably kept in the normal-mode for some minimum time, Nmin, via the timing test at 220. If, at 220, the minimum normal-mode time has elapsed, measures of the intermodulation distortion are obtained, at 230. The process remains in loop 230-240 until the measures indicate that the distortion is at or above some minimum level IMmin.

If, at 240, the measures indicate intermodulation distortion above the minimum level IMmin, the receiver is placed in the "wide-mode", wherein a DC notch filter with a notch-width of about +/−60 kHz is engaged, at 250. At 260, the measures of intermodulation distortion are obtained again, and compared with the measures taken in the normal-mode, at 270. If the measures indicate an improvement, the receiver remains in the wide-mode and continues to execute the loop 260-290 until a maximum time limit is exceeded, at 290. The receiver is preferably allowed to remain in the wide-mode for a limited amount of time only, to assure that the normal operation of the receiver, such as the aforementioned dynamic sensitivity adjustment, and so on, is maintained.

If, at 270, the measures obtained while in the wide-mode do not indicate an improvement compared to those obtained in the normal-mode, the filter is returned to the normal-mode, at 210. Optionally, at 280, if the measures indicate that a change of environment has occurred, suggesting that the source of interference may have been removed, the filter is returned to the normal-mode, at 210, to re-assess the normal-mode conditions.

The following is a first preferred method of determining whether intermodulation distortion is present. This first preferred method has the advantage that the measures used to determine whether intermodulation distortion is present are typically available as digital signals within the baseband processor (160 of FIG. 1) of a typical zero-IF receiver (100).

Conventional portable receivers provide a measure of received signal strength, commonly termed the RSSI, that is commonly used to dynamically adjust the receiver gain. Conventional portable digital receivers also provide a measure of the effective bit energy relative to the noise floor, commonly termed the Eb/Nt ratio. For a given RSSI, a minimum Eb/Nt ratio can be expected; and, up to a limit, the Eb/Nt can be expected to increase with increasing RSSI. In the presence of intermodulation distortion, however, the RSSI increases, but the corresponding increase in Eb/Nt ratio does not occur, because the intermodulation distortion increases the noise floor, Nt, thereby reducing the Eb/Nt ratio. Therefore, these two measures can be used to detect the presence of intermodulation distortion, as detailed below.

Using the example flow diagram of FIG. 2 as a reference, the block 230 is configured to obtain the RSSI and Eb/Nt measures, averaged over about a millisecond. The test block 240 compares the RSSI to a predefined minimum signal strength, and the Eb/Nt ratio to a predefined energy threshold. If the RSSI is above the minimum signal strength, and the Eb/Nt ratio is below the energy threshold, the receiver is placed in the wide-mode, at 250, to filter-out second-order intermodulation distortion that occurs at zero-frequency (DC).

When the wide-mode filter is enabled, the measured signal strength can be expected to decrease, regardless of whether intermodulation distortion is present, because less of the received signal is being passed by the wide-mode notch filter. This decrease can be predetermined, assuming the absence of intermodulation distortion, using techniques common in the art of filter design. If, at 270, the measured decrease in received signal strength is larger than the predetermined decrease, it can be assumed that intermodulation distortion, or other anomalous interference within the notch-width of the filter, had been present, and is now removed by the wide-mode filter. Also, at 270, if enabling the wide-mode filter has decreased interference, the Eb/Nt ratio should increase relative to the measured Eb/Nt ratio in the normal-mode. In a preferred embodiment, if either the measured decrease in signal strength exceeds the predetermined decrease, or if the measured Eb/Nt ratio increases, the wide-mode filter is considered to be doing "better" than the normal-mode filter, and the receiver remains in the loop 260-290.

At 280, if either the received signal strength or the Eb/Nt ratio increases substantially compared to when the wide-mode was first enabled, it may be assumed that the environment has changed, and the receiver is placed in normal mode, at 210, to invoke the aforementioned normal operations, such as dynamic sensitivity adjustment and others.

Figure 3:
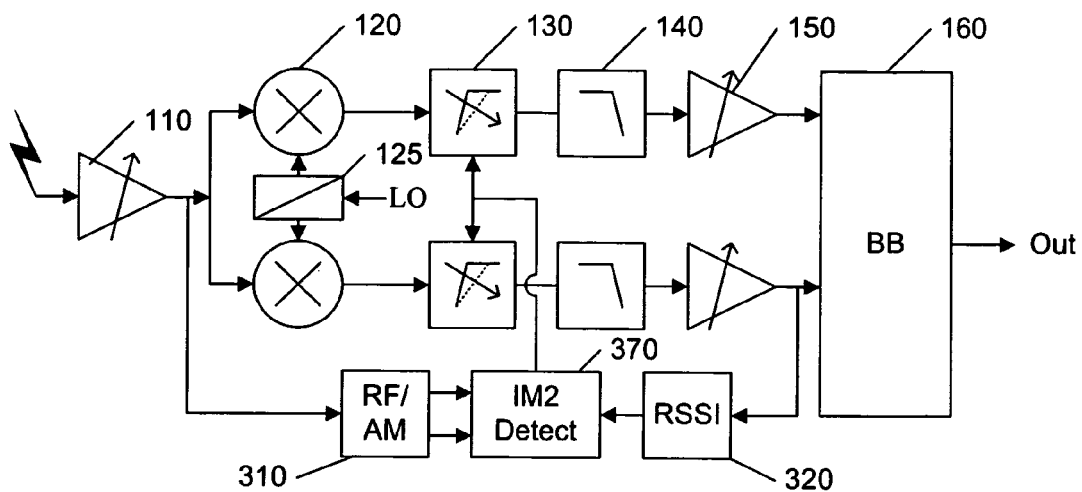
FIG. 3 illustrates a second example block diagram of a zero-IF receiver with adaptive intermodulation distortion filtering in accordance with this invention.

FIG. 3 illustrates a second preferred method of determining whether intermodulation distortion is present. This second preferred method has the advantage that it is independent of the baseband processor (160 of FIG. 1) and thus could be implemented regardless of techniques used in the baseband processor and could be embodied in any zero-IF receiver. A disadvantage of this method, however, is that it requires additional circuitry to provide the measures used to detect the presence of intermodulation distortion.

A detector 310 receives the output of the RF amplifier 110 and provides an estimate of the RF energy and the AM content of the received RF signal, for example via a squaring function. Another detector 320 samples the output of the amplifier 150 to provide an estimate of the RSSI. The outputs of the detectors 310 and 320 are provided to the intermodulation distortion detector 370. When intermodulation distortion occurs, the RF energy and AM content increase disproportionately to the increase in the RSSI. If the RF energy and AM content are high, but the RSSI is low, intermodulation is likely to be present, and the detector 370 places the receiver in the wide-mode to filter-out the intermodulation distortion.

Figure 4:
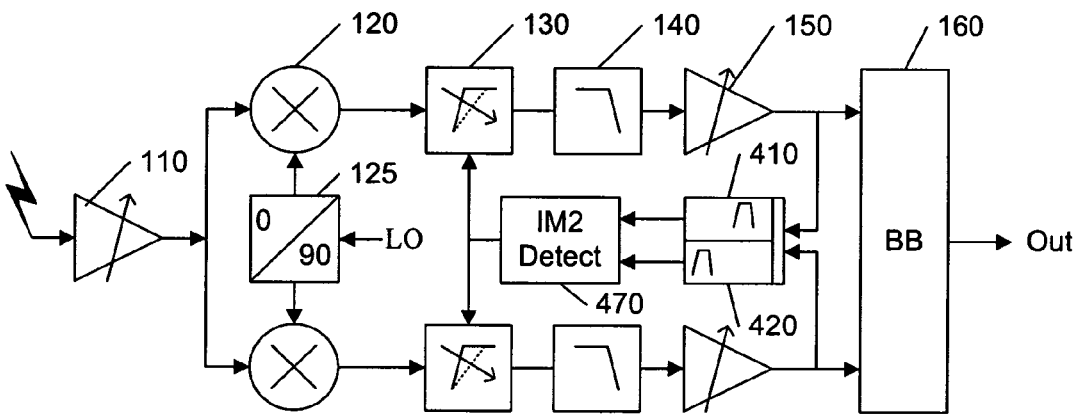
FIG. 4 illustrates a third example block diagram of a zero-IF receiver with adaptive intermodulation distortion filtering in accordance with this invention.

FIG. 4 illustrates a third preferred method of determining whether intermodulation distortion is present. This third preferred method has the advantage that it can be embodied in either analog or digital form. As in the second preferred method, however, this method also requires circuitry that is not generally found in a conventional zero-IF receiver.

In this third method, two filters 410, 420 provide samples of the energy content in the baseband. One sample is taken at a low frequency in the baseband, within the band where intermodulation distortion is expected to occur (e.g. within +/−60 kHz of DC), and the other is taken at a higher frequency within the baseband channel, but beyond the band where intermodulation distortion is expected to occur. The intermodulation detector 470 compares these two samples to directly determine the presence of intermodulation distortion, via an increase in the first sample without a corresponding increase in the second sample, and it will also directly indicate the cessation of the intermodulation distortion, via a subsequent drop in the first sample, while in the wide-mode, without a drop in the second.

Figure 5:
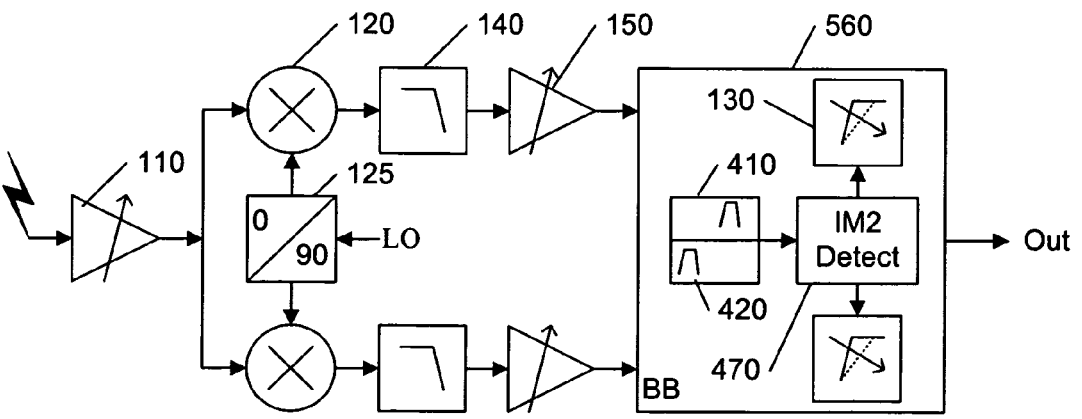
FIG. 5 illustrates a fourth example block diagram of a zero-IF receiver with adaptive intermodulation distortion filtering in accordance with this invention.

The foregoing merely illustrates the principles of the invention in a variety of embodiments. It will thus be appreciated that those skilled in the art will be able to devise other arrangements which, although not explicitly described or shown herein, embody the principles of the invention and are thus within its spirit and scope. For example, one of ordinary skill in the art will recognize that the particular structures in the figures are presented for ease of understanding, and that the functions of the various blocks may be performed by other blocks. For example, some or all of the functions may be performed as digital functions in the baseband processor, as illustrated in FIG. 5. In this example, the baseband processor 560 includes the functions of the previously defined configurable notch-filter 130, the two sampling filters 410, 420, and intermodulation distortion detector 470. In like manner, the principles of this invention are not limited to a particular receiver configuration. For example, although this invention is presented in the context of a quadrature receiver, one of ordinary skill in the art will recognize that the principles presented herein are relatively independent of the modulation techniques used to communicate information via RF signals, and thus can be embodied in any zero-IF receiver system. These and other system configurations and embodiments will be evident to one of ordinary skill in the art in view of this disclosure, and are included within the scope of the following claims.

The invention claimed is:

1. A method of reducing the effects of second order intermodulation distortion in a zero-IF receiver, comprising: receiving an RF signal, modulating and amplifying the RF signal to provide one or more baseband signals, then detecting an occurrence of intermodulation distortion within the one or more baseband signals, and selectively enabling a wide mode of a wide-notch filter having a predetermined wide mode and a normal mode, said wide mode having a wider frequency range than said normal mode for attenuating signal components of the one or more baseband signals within the predetermined wide mode frequency range of the wide-notch filter to reject the second order intermodulation distortion, wherein detecting the occurrence of intermodulation distortion comprises determining a plurality of signal strength measures, and determining the occurrence of intermodulation distortion based on a relationship among the plurality of signal strength measures, the plurality of signal strength measures comprising an RSSI measure and an Eb/Nt measure, and determining the occurrence of intermodulation distortion if:

Eb/Nt<energy threshold; and

RSSI<minimum signal strength;

and maintaining the wide mode enablement of the filter while either a decrease in RSSI exceeds a predetermined decrease or an increase in the Eb/Nt ratio exceeds a predetermined normal Eb/Nt ratio.

2. The method of claim 1, wherein the predetermined wide mode notch-width is approximately +/−60 kHz, and approximately centered at zero-Hertz.

3. The method of claim 1, further including detecting a cessation of the intermodulation distortion, and selectively disabling the wide mode of the wide-notch filter, based on the cessation of the intermodulation distortion.

4. The method of claim 1, further including disabling the wide mode of the wide-notch filter, based on a duration since enabling the wide mode of the wide-notch filter.

5. A receiver comprising: a mixer that is configured to convert a received RF signal to an analog baseband signal, an amplifier to amplify the analog baseband signal, a detector that is configured to assert a detection signal when intermodulation distortion is detected in the amplified analog baseband signal, a wide-notch filter having a predetermined wide mode and a normal mode coupled to an output of the mixer and having an output coupled to an input of the amplifier, said wide mode having a wider frequency range than said normal mode, said filter being operably coupled to the mixer and the detector, the detector configured to activate the wide mode of the wide-notch filter for selectively attenuating second order intermodulation distortion signal components in the analog baseband signal when the detection signal is asserted, and a baseband processor that is configured to receive the analog baseband signal and to provide therefrom a receiver output, wherein the baseband processor further configured to provide digital measures of signal strengths in the analog baseband signal, and the detector operably coupled to the baseband processor and configured to detect the intermodulation distortion in the analog baseband signal based on the digital measures of signal strengths from the baseband processor, the digital measures of signal strengths comprising an RSSI measure and an Eb/Nt measure; and the detector configured to assert the detection signal when:

Eb/Nt<energy threshold; and

RSSI<minimum signal strength;

and to maintain the wide mode enablement of the filter while either a decrease in RSSI exceeds a predetermined decrease or an increase in the Eb/Nt ratio exceeds a predetermined normal Eb/Nt ratio.

6. The receiver of claim 5, wherein the wide-notch filter is configured to selectively attenuate signal components within approximately +/−60 kHz of zero-Hertz when the detection signal is asserted.

7. The receiver of claim 5, wherein the detector is further configured to de-assert the detection signal to activate the normal mode of the wide-notch filter based on a duration since asserting the detection signal.

8. The receiver of claim 5, wherein the baseband processor is further configured to provide the first and second measures of energy to the detector.

9. The receiver of claim 5, wherein the received RF signal is a quadrature-modulated signal, and the mixer is configured to provide a pair of quadrature signals that comprise the analog baseband signal.

10. The receiver of claim 5, wherein the filter is a digital filter that is included within the baseband processor.

* * * * *

UNITED STATES PATENT AND TRADEMARK OFFICE
CERTIFICATE OF CORRECTION

PATENT NO.         : 7,706,769 B2  
APPLICATION NO.    : 10/560852  
DATED              : April 27, 2010  
INVENTOR(S)        : Richard Perkins Page 1 of 1

It is certified that error appears in the above-identified patent and that said Letters Patent is hereby corrected as shown below:

Column 5  
Claim 1, Line 52, "RSSI<minimum signal strength;" should read as --RSSI>minimum signal strength;--.

Column 6  
Claim 5, Line 34, "RSSI<minimum signal strength;" should read as --RSSI>minimum signal strength;--.

Signed and Sealed this  
Twenty-eighth Day of December, 2010

David J. Kappos  
*Director of the United States Patent and Trademark Office*